US012597119B2

(12) United States Patent
Lee et al.

(10) Patent No.: US 12,597,119 B2
(45) Date of Patent: Apr. 7, 2026

(54) OPERATING METHOD OF ELECTRONIC DEVICE INCLUDING PROCESSOR EXECUTING SEMICONDUCTOR LAYOUT SIMULATION MODULE BASED ON MACHINE LEARNING

(71) Applicant: Samsung Electronics Co., Ltd., Suwon-si (KR)

(72) Inventors: Sooryong Lee, Seoul (KR); Jaewon Yang, Suwon-si (KR); Kyoung Cho Na, Hwaseong-si (KR); Jihong Kim, Seongnam-si (KR); Sang Chul Yeo, Osan-si (KR); Hyeok Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 558 days.

(21) Appl. No.: 18/060,260

(22) Filed: Nov. 30, 2022

(65) Prior Publication Data

US 2023/0281792 A1 Sep. 7, 2023

(30) Foreign Application Priority Data

Mar. 4, 2022 (KR) ........................ 10-2022-0027906

(51) Int. Cl.
G06T 7/00 (2017.01)
G06F 30/392 (2020.01)
(Continued)

(52) U.S. Cl.
CPC ............ G06T 7/001 (2013.01); G06F 30/392 (2020.01); G06T 3/40 (2013.01); G06T 11/00 (2013.01);
(Continued)

(58) Field of Classification Search
CPC .. G06F 30/392; G06F 30/398; G06F 2115/02; G06F 2115/10; G06F 30/27;
(Continued)

(56) References Cited

U.S. PATENT DOCUMENTS 9,671,686 B2 6/2017 Choi et al.
9,747,408 B2 8/2017 Huang et al.
(Continued)

FOREIGN PATENT DOCUMENTS

JP 2020197667 A * 12/2020 ............... G03F 1/70
KR 2007097816 A * 10/2007 ............. G09G 3/006
(Continued)

OTHER PUBLICATIONS

"Deep Learning GAN Tutorial—GAN start to new GAN trand," Jun. 17, 2020.

*Primary Examiner* — John Villecco
*Assistant Examiner* — Kyla Guan-Ping Tiao Allen
(74) *Attorney, Agent, or Firm* — Harness, Dickey & Pierce, P.L.C.

(57) ABSTRACT

Disclosed is an operating method of an electronic device which includes a processor executing a semiconductor layout simulation module based on machine learning. The operating method includes receiving, at the semiconductor layout simulation module executed by the processor, a layout image, inferring a wafer image based on the layout image and a fabrication device information image of a semiconductor fabrication device fabricating a semiconductor integrated circuit based on a final layout image, adjusting the layout image when the wafer image is not acceptable, and confirming the layout image as the final layout image when the wafer image is acceptable.

19 Claims, 15 Drawing Sheets

(51) Int. Cl.

| | |
|---|---|
| *G06F 30/398* | (2020.01) |
| *G06F 115/02* | (2020.01) |
| *G06N 20/00* | (2019.01) |
| *G06T 3/40* | (2006.01) |
| *G06T 11/00* | (2006.01) |
| *H10D 89/10* | (2025.01) |

(52) U.S. Cl.

CPC ............... *G06T 2207/20081* (2013.01); *G06T 2207/30148* (2013.01)

(58) Field of Classification Search

CPC ........ H10D 89/10; G06N 20/00; G06T 7/001; G06T 3/40; G06T 11/00; G06T 2207/20081; G06T 2207/30148

See application file for complete search history.

(56) References Cited

U.S. PATENT DOCUMENTS

| | | | |
|---|---|---|---|
| 10,223,494 | B2 | 3/2019 | Shin et al. |
| 10,909,431 | B2 | 2/2021 | Tseng et al. |
| 10,937,629 | B2 | 3/2021 | Teguri et al. |
| 11,126,782 | B2 | 9/2021 | Lugg et al. |
| 2015/0227673 | A1 | 8/2015 | Lee et al. |
| 2016/0148850 | A1* | 5/2016 | David ..................... G06N 7/01 |
| | | | 355/53 |
| 2016/0162627 | A1* | 6/2016 | Wang .................... G06F 30/398 |
| | | | 716/53 |
| 2017/0139317 | A1* | 5/2017 | Shin .......................... G03F 1/36 |
| 2019/0073566 | A1* | 3/2019 | Brauer ................. G06V 10/776 |
| 2020/0226742 | A1* | 7/2020 | Sawlani ........... H01L 21/67288 |
| 2020/0356011 | A1 | 11/2020 | Su et al. |
| 2021/0216697 | A1* | 7/2021 | Van Den Brink .... G06F 30/398 |
| 2021/0232745 | A1* | 7/2021 | Chou .................... G06N 3/045 |
| 2021/0263428 | A1 | 8/2021 | Chen |
| 2021/0373443 | A1* | 12/2021 | Huang ............... G06F 16/2379 |
| 2023/0258446 | A1* | 8/2023 | Moon ................... G01B 11/24 |
| | | | 702/155 |

FOREIGN PATENT DOCUMENTS

| | | | |
|---|---|---|---|
| KR | 10-2020-0035303 | A | 4/2020 |
| KR | 10-2227127 | B1 | 3/2021 |

\* cited by examiner

FIG. 2

1st
direction

2nd
direction

FIG. 8

OPERATING METHOD OF ELECTRONIC DEVICE INCLUDING PROCESSOR EXECUTING SEMICONDUCTOR LAYOUT SIMULATION MODULE BASED ON MACHINE LEARNING

CROSS-REFERENCE TO RELATED APPLICATIONS

This application claims priority under 35 U.S.C. § 119 to Korean Patent Application No. 10-2022-0027906 filed on Mar. 4, 2022, in the Korean Intellectual Property Office, the disclosure of which is incorporated by reference herein in its entirety.

BACKGROUND

Embodiments of the present disclosure described herein relate to an electronic device, and more particularly, relate to an operating method of an electronic device including a processor that executes a semiconductor layout simulation module inferring an image of a semiconductor integrated circuit based on machine learning.

A semiconductor integrated circuit is implemented by forming various circuit patterns on a silicon wafer. The process of fabricating a semiconductor integrated circuit may include optical proximity correction (OPC) and process proximity correction (PPC). For example, the OPC may be used to correct errors that occur in the process of forming photo resist patterns and/or PPC may be used to correct errors that occur in an etching process.

The OPC and/or PPC may be performed based on the critical dimension (CD) of a semiconductor pattern or may be performed based on a contour of a semiconductor pattern. The CD- and/or contour-based OPC and/or PPC may require a lot of computations (or operations). In addition, the CD- and/or contour-based OPC and/or PPC uses only a portion of information of semiconductor patterns. In these cases, an OPC and/or PPC result may include an error.

SUMMARY

Embodiments of the present disclosure provide a method of performing pixel-based simulation on a semiconductor integrated circuit by using machine learning. Embodiments of the present disclosure provide a method of simulating a semiconductor integrated circuit based on a unique characteristic of an extreme ultraviolet (EUV)-based semiconductor fabrication device and a long-range layout.

According to an embodiment, a method of confirming a semiconductor layout using an electronic device which includes a processor configured to execute a semiconductor layout simulation module based on machine learning includes receiving, at the semiconductor layout simulation module, a layout image; generating, at the semiconductor layout simulation module, a wafer image based on the layout image and a fabrication device information image of at least one semiconductor integrated circuit fabricated by a semiconductor fabrication device based on at least one final layout image; determining whether the wafer image is acceptable; adjusting the layout image when the wafer image is not acceptable; and confirming the layout image as the final layout image when the wafer image is acceptable.

According to an embodiment, a method of generating layout image using an electronic device which includes a processor configured to execute a semiconductor layout simulation module based on machine learning includes receiving, at the semiconductor layout simulation module, a target wafer image, the target wafer image including a target pattern to be patterned in a semiconductor integrated circuit; and generating a layout image based on a density image and the target wafer image, and the density image includes information about a density of patterns of a region which includes the target wafer image and is wider than the target wafer image.

According to an embodiment, a method of confirming a semiconductor layout using an electronic device which includes a processor configured to execute a semiconductor layout simulation module based on machine learning includes receiving, at the semiconductor layout simulation module, a target wafer image; generating, at the semiconductor layout simulation module, a layout image based on the target wafer image and at least one of a density image and a fabrication device information image of a semiconductor integrated circuit fabricated by a semiconductor fabrication device based on a final layout image; a wafer image based on the layout image and at least one of the fabrication device information image and the density image; determining whether the wafer image is acceptable based on a comparison of the generated wafer image and the target wafer image; adjusting the layout image when the wafer image is not acceptable; and confirming the layout image as the final layout image when the wafer image is acceptable, and the density image includes information about a density of patterns of a region which includes the layout image and is wider than the layout image.

BRIEF DESCRIPTION OF THE FIGURES

The above and other objects and features of the present disclosure will become apparent by describing in detail embodiments thereof with reference to the accompanying drawings.

FIG. 2 illustrates an example of a semiconductor layout simulation module in detail.

FIG. 8 illustrates an example of a semiconductor layout simulation module in detail.

DETAILED DESCRIPTION

Below, some example embodiments of the present disclosure will be described in detail and clearly to such an extent that an ordinary one in the art easily implements the present disclosure. In the description and in the accompanying drawings, like numerals refer to like elements throughout. Therefore, the repeated descriptions of like element may be omitted. Below, the term "and/or" is interpreted as including any one of items listed with regard to the term, or a combination of some of the listed items.

Figure 1:
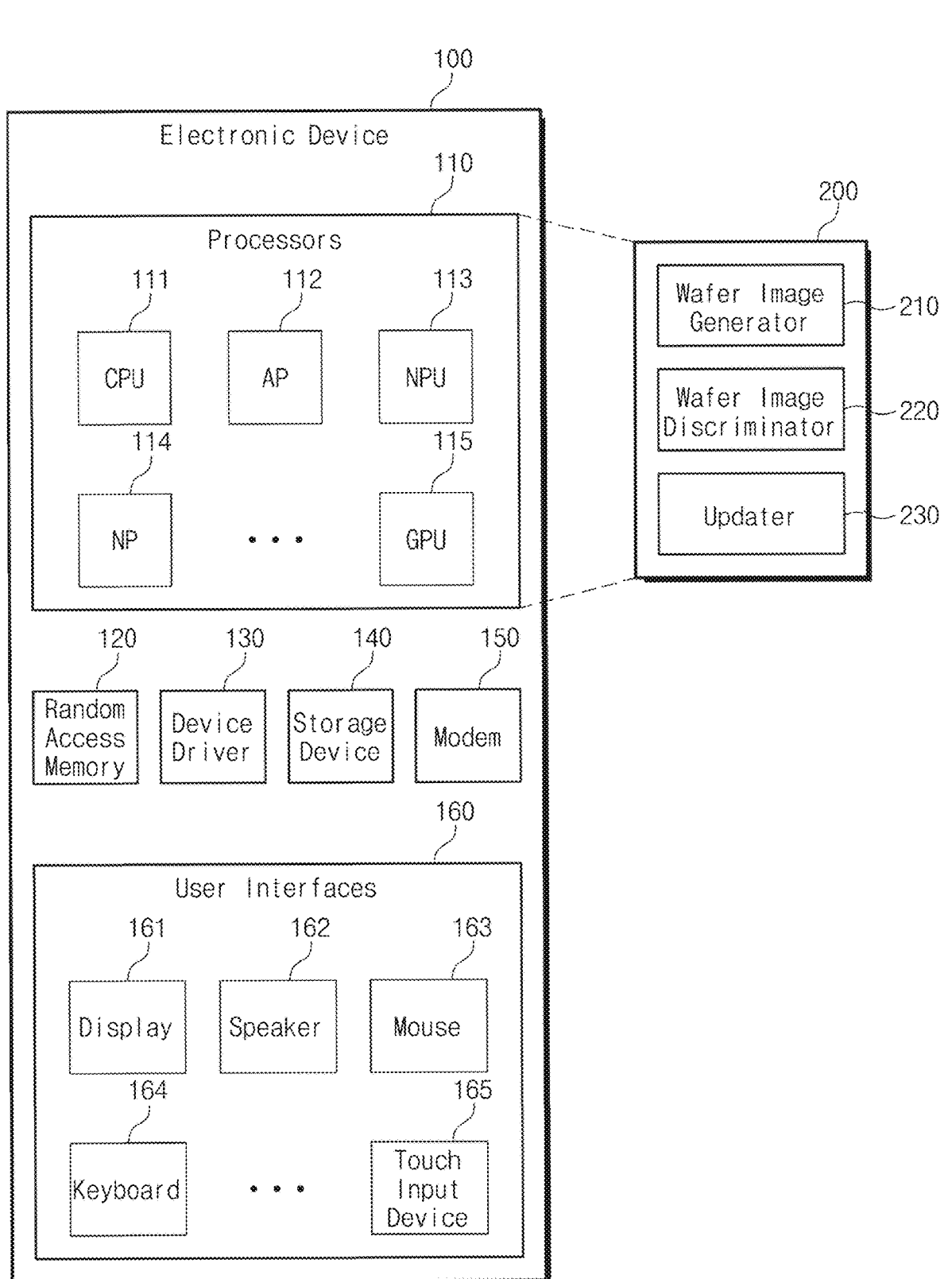
FIG. 1 is a block diagram illustrating an electronic device according to at least one example embodiment of the present disclosure.

FIG. 1 is a block diagram illustrating an electronic device 100 according to at least one example embodiment of the present disclosure. Referring to FIG. 1, the electronic device 100 may include processors 110, a random access memory 120, a device driver 130, a storage device 140, a modem 150, and user interfaces 160.

The processors 110 may include, for example, at least one general-purpose processor such as a central processing unit (CPU) 111 and/or an application processor (AP) 112. Also, the processors 110 may further include at least one special-purpose processor such as a neural processing unit (NPU) 113, a neuromorphic processor 114, and/or a graphics processing unit (GPU) 115. Though the processors 110 are illustrated as including the CPU 111, the AP 112, the NPU 113, the neuromorphic processor 114 and the GPU 115, the example embodiments are not limited thereto. For example, the processors 110 may include fewer or more processors, and/or, in some example embodiments, the processors 110 may include two or more homogeneous processors.

At least one of the processors 110 may drive (or operate) a semiconductor layout simulation module 200. For example, the semiconductor layout simulation module 200 may be implemented in the form of instructions (and/or codes) that are executed by at least one of the processors 110. In this case, the at least one processor may load the commands (and/or codes) of the semiconductor layout simulation module 200 to (and/or from) a memory (e.g., the random access memory 120 and/or the storage device 140).

In some example embodiments, at least one processor of the processors 110 may be fabricated to implement the semiconductor layout simulation module 200. For example, at least one processor may be a dedicated processor that implements (e.g., in hardware) functions of the semiconductor layout simulation module 200.

The random access memory 120 may be used as a working memory of the processors 110 and may be used as a main memory and/or a system memory of the electronic device 100. The random access memory 120 may include a volatile memory (such as a dynamic random access memory a static random access memory, and/or the like) and/or a nonvolatile memory (such as a phase-change random access memory, a ferroelectric random access memory, a magnetic random access memory, a resistive random access memory, and/or the like).

The random access memory 120 may store images that are necessary for and/or utilized in the learning (or training) of the semiconductor layout simulation module 200. For example, the random access memory 120 may receive images from the storage device 140 and/or from an external device (e.g., a database) through the modem 150.

The device driver 130 may control at least one of the following peripheral devices depending on a request of the processors 110: the storage device 140, the modem 150, and/or the user interfaces 160. The storage device 140 may include a stationary storage device (such as a hard disk drive, a solid state drive, and/or the like) and/or a removable storage device (such as an external hard disk drive, an external solid state drive, a removable memory card, and/or the like).

The storage device 140 may store images that are necessary for and/or utilized in the learning (or training) of the semiconductor layout simulation module 200. The images stored in the storage device 140 may be loaded onto the random access memory 120 and may be used for the learning (or training) of the semiconductor layout simulation module 200.

The modem 150 may provide remote communication with the external device. The modem 150 may perform wired or wireless communication with the external device. The modem 150 may communicate with the external device based on at least one of various communication schemes such as Ethernet, wireless-fidelity (Wi-Fi), long term evolution (LTE), 5th generation (5G) mobile communication, and/or the like. The modem 150 may receive images, which are necessary for the learning of the semiconductor layout simulation module 200, from the external device, for example, the database. The modem 150 may load the received images onto the random access memory 120.

The user interfaces 160 may receive information from a user and may provide information to the user. The user interfaces 160 may include at least one user output interface such as a display 161 or a speaker 162, and at least one user input interface such as a mouse 163, a keyboard 164, a touch input device 165, and/or the likes. The user interfaces 160 may include more or fewer output interfaces and/or input interfaces than illustrated.

The commands (or codes) of the semiconductor layout simulation module 200 may be received through the modem 150 and may be stored in the storage device 140. The commands (or codes) of the semiconductor layout simulation module 200 may be stored in a removable storage device, and the removable storage device may be connected with the electronic device 100. The commands (or codes) of the semiconductor layout simulation module 200 may be loaded and executed onto the random access memory 120 from the storage device 140.

The semiconductor layout simulation module 200 may include a wafer image generator 210, a wafer image discriminator 220, and an updater 230. The wafer image generator 210 may be trained to generate, from a layout image (e.g., an original layout image to which the OPC or PPC is not applied or an adjusted layout image to which the OPC or PPC is applied) for fabricating a semiconductor integrated circuit, a wafer image that is expected as being fabricated when the semiconductor integrated circuit is fabricated based on the layout image.

The wafer image discriminator 220 may discriminate which of a wafer image (e.g., an image obtained by capturing a semiconductor integrated circuit formed on a semiconductor wafer by using an imaging device such as a scanning electron microscope (SEM)) of the semiconductor integrated circuit and the wafer image generated by the wafer image generator 210 is true or which thereof is false. The updater 230 may train the wafer image generator 210 and the wafer image discriminator 220, e.g., depending on a discrimination result of the wafer image discriminator 220.

In at least one embodiment, the wafer image generator 210, the wafer image discriminator 220, and the updater 230 may be implemented based on a generative adversarial network (GAN) or a conditional GAN (CGAN). In at least one embodiment, the wafer image generator 210, the wafer image discriminator 220, and the updater 230 may perform the learning based on the images stored in the random access memory 120.

Figure 2:
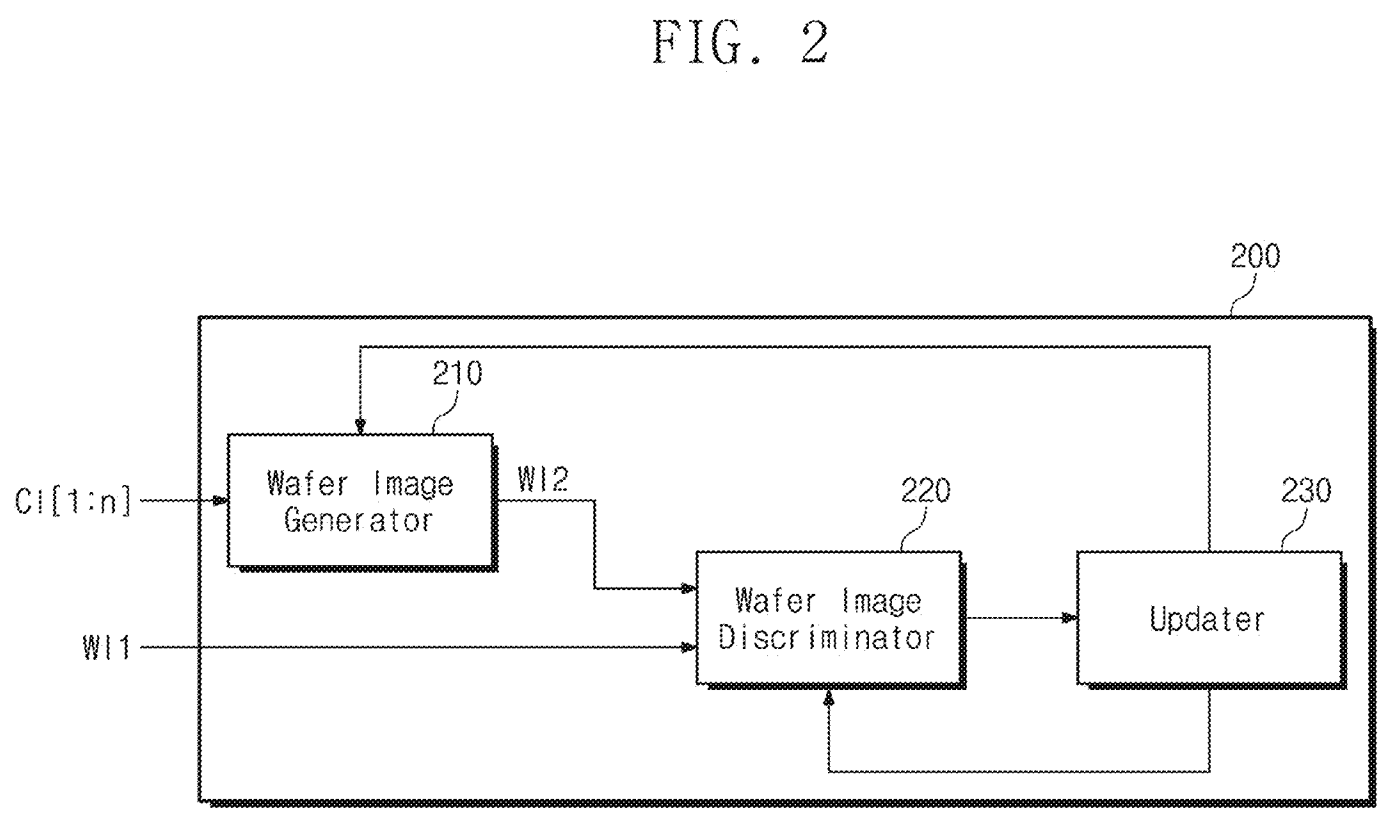

FIG. 2 illustrates an example of the semiconductor layout simulation module 200 in detail. Referring to FIGS. 1 and 2, the semiconductor layout simulation module 200 may receive multi-channel images CI[1:n] and a first wafer image WI1. In at least one embodiment, the multi-channel images CI[1:n] and/or a first wafer image WI1 may be received from the memory 120 and/or from an imaging device (e.g., an SEM). The first wafer image WI1 may refer to an SEM image captured after a semiconductor integrated circuit is formed. For example, the first wafer image WI1 may be a portion cropped from an original wafer image.

The multi-channel images CI[1:n] may include a plurality of images. The multi-channel images CI[1:n] may include first to n-th images (where n represents an integer greater than 1). Each of the first to n-th images may include effects of various factors on the process of fabricating the semiconductor integrated circuit. One of the multi-channel images CI[1:n] may include a layout image for fabricating a semiconductor integrated circuit. The layout image may be a portion cropped from the original layout image, for example, a portion corresponding to the first wafer image WI1.

The wafer image generator 210 may generate a second wafer image WI2 from the multi-channel images CI[1:n]. For example, the wafer image generator 210 may generate the second wafer image WI2 from the multi-channel images CI[1:n] by using internal parameters.

The wafer image discriminator 220 may receive the first wafer image WI1 and the second wafer image WI2. The wafer image discriminator 220 may discriminate which of the first wafer image WI1 and the second wafer image WI2 is a true (e.g., captured) wafer image and which thereof is a false (e.g., generated or inferred) wafer image. For example, by using the internal parameters, the wafer image discriminator 220 may discriminate which of the first wafer image WI1 and the second wafer image WI2 is a true wafer image and/or which is a false wafer image.

The updater 230 may receive a discrimination result of the wafer image discriminator 230. The updater 230 may train the wafer image generator 210 and the wafer image discriminator 220 sequentially or simultaneously, based on the discrimination result. For example, the updater 230 may train the wafer image generator 210 by updating the internal parameters of the wafer image generator 210, and/or the updater 230 may train the wafer image discriminator 220 by updating the internal parameters of the wafer image discriminator 220.

Figure 3:
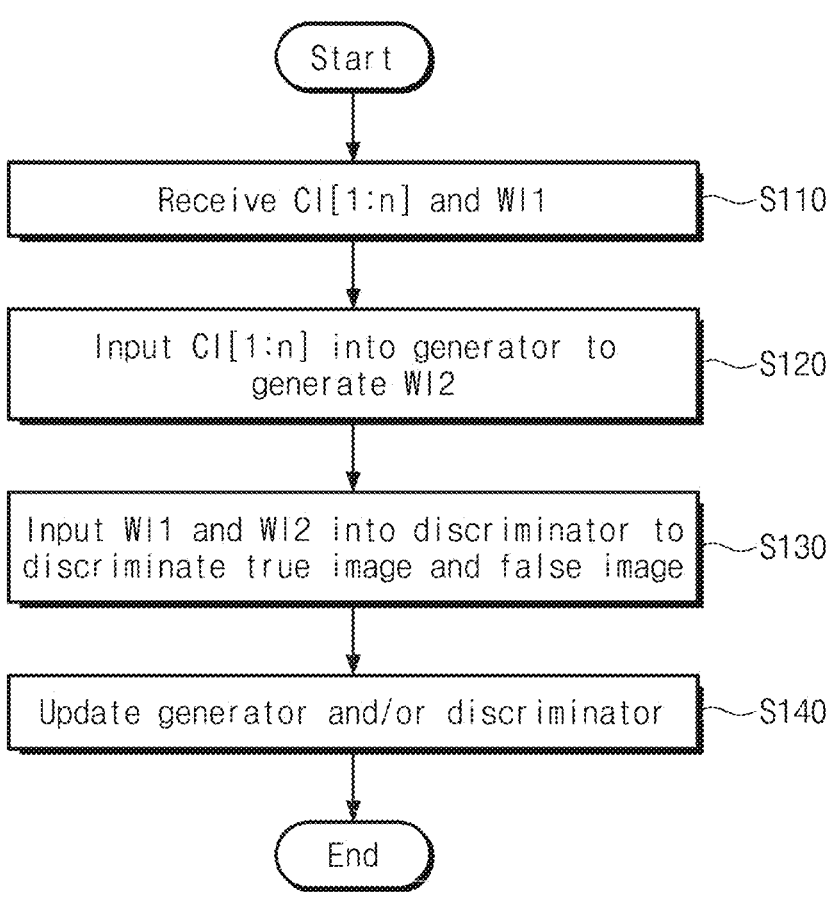
FIG. 3 illustrates an operating method of a semiconductor layout simulation module executed by processors.

FIG. 3 illustrates an operating method of the semiconductor layout simulation module 200 executed by the processors 110. Referring to FIGS. 1, 2, and 3, in operation S110, the processors 110 may receive the multi-channel images CI[1:n] and the first wafer image WI1. For example, the processors 110 may receive the multi-channel images CI[1:n] and the first wafer image WI1 from the memory 120. For example, in some example embodiments, the first wafer image WI1 may be a "true" image of a wafer taken by an imaging device.

In operation S120, the processors 110 may input the multi-channel images CI[1:n] into the wafer image generator 210 of the semiconductor layout simulation module 200 to generate the second wafer image WI2. For example, in some example embodiments, the second wafer image WI2 may be (and/or include) a "fake" image generated by the wafer image generator 210.

In operation S130, the processors 110 may input the first wafer image WI1 and the second wafer image WI2 into the wafer image discriminator 220 of the semiconductor layout simulation module 200 to discriminate the true image and the false image.

In operation S140, the processors 110 may execute the updater 230 of the semiconductor layout simulation module 200 such that the wafer image generator 210 and/or the wafer image discriminator 220 is updated based on a discrimination result. For example, the updater 230 may calculate a loss function based on whether the discrimination result is correct or incorrect. The updater 230 may update the wafer image generator 210 and/or the wafer image discriminator 220 based on the loss function.

In at least one embodiment, the processors 110 of the electronic device 100 may repeatedly train the semiconductor layout simulation module 200 by using sets each including a wafer image and the multi-channel images CI[1:n] corresponding thereto. The processors 110 of the electronic device 100 may collect discrimination results that are based on a given number of sets of images and may update the internal parameters of the wafer image generator 210 and/or the wafer image discriminator 220 based on the collected discrimination results.

As the degree of integration of the semiconductor integrated circuit increases and a line width decreases, it may be substantially impossible to generate (and/or infer) the whole wafer image based on the multi-channel images CI[1:n] including the whole layout image for the semiconductor integrated circuit. Accordingly, the generation (and/or inference) and discrimination of the wafer image may be performed based on the multi-channel images CI[1:n] including a layout image cropped from the whole layout image and/or a corresponding portion (e.g., a cropped portion) of the whole wafer image.

According to the above process of detecting a defect, the first wafer image WI1 that is used for the semiconductor layout simulation module 200 to perform machine learning may be an image cropped from an original or true wafer image. Also, the multi-channel images CI[1:n] that are used for the semiconductor layout simulation module 200 to perform machine learning may be images that are cropped from original images respectively corresponding to the multi-channel images CI[1:n], and locations of the cropped images on the original images may respectively correspond to locations of the first wafer image WI1.

Figure 4:
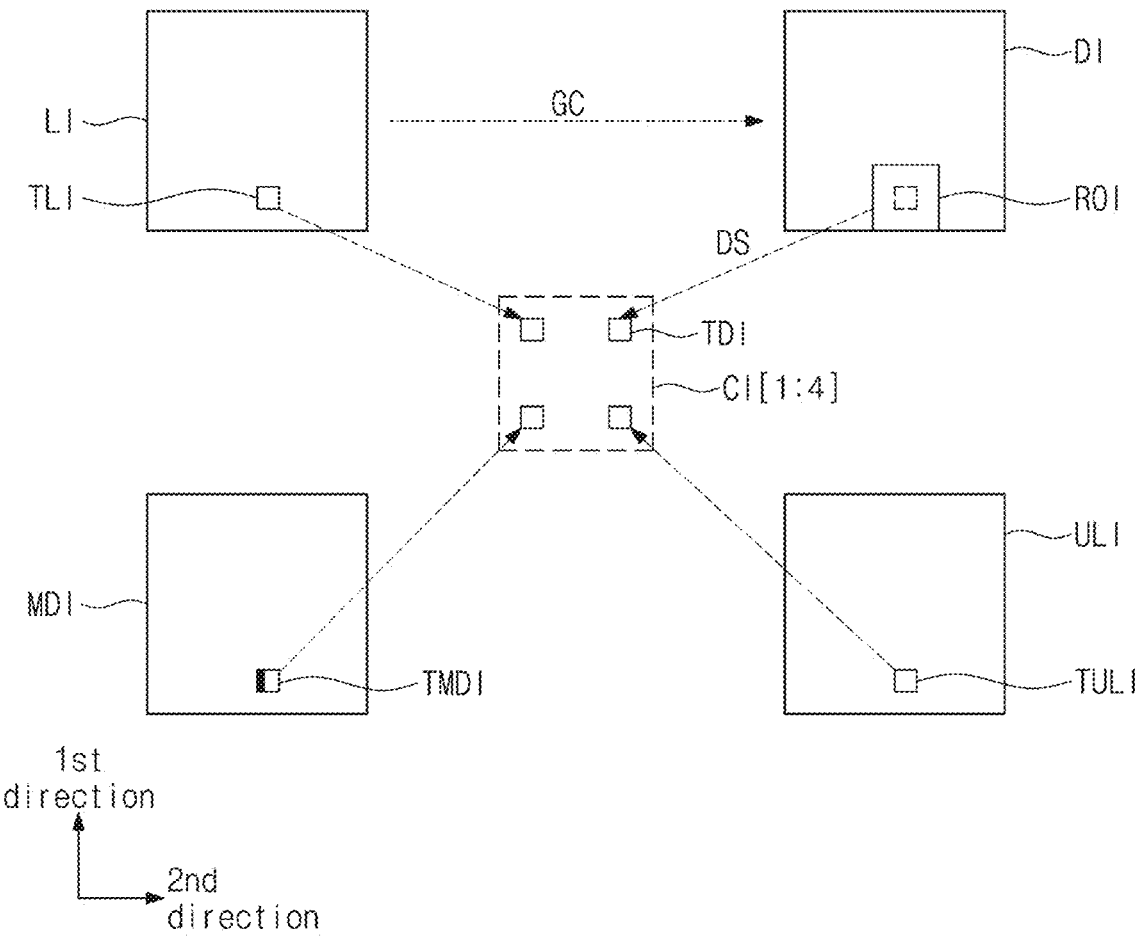
FIG. 4 illustrates examples of multi-channel images.

FIG. 4 illustrates examples of the multi-channel images CI[1:n]. In at least one embodiment, the multi-channel images CI[1:n] may include 4 images, and "n" may be 4. However, a value of "n" is not limited thereto. Referring to FIGS. 2 and 4, the multi-channel images CI[1:4] may be cropped from a layout image LI, a under layout image ULI, a fabrication device information image MDI, and a density image DI.

For example, a semiconductor integrated circuit may include a plurality of layers that are sequentially stacked. The layout image LI may refer to a layout image for forming a current layer, for example, an original layout image to which the OPC or PPC is not applied and/or an adjusted layout image to which the OPC or PPC is applied. As a target layout image TLI for machine learning, a portion of the layout image LI may be selected as one of the multi-channel images CI[1:4].

The under layout image ULI may refer to a layout image to be used upon forming an under layer, for example, an original layout image to which the OPC or PPC is not applied and/or an SEM image. As a target under layout image TULI for machine learning, a portion of the under layout image ULI may be selected as one of the multi-channel images CI[1:4]. A location of the target under layout image TULI on the under layout image ULI may correspond to (e.g., may be similar and/or identical to) a location of the target layout image TLI on the layout image LI.

The fabrication device information image MDI may include information about the effect of the semiconductor fabrication device on the process in which the fabrication device forms a semiconductor integrated circuit. For example, information about effects of the semiconductor fabrication device, which are different depending on locations on the layout image LI, may be included in the fabrication device information image MDI.

For example, a slit of the EUV-based semiconductor fabrication device may differently affect the semiconductor integrated circuit depending on locations on the layout image LI. The fabrication device information image MDI may include an effect information image of the slit.

As a target fabrication device information image TMDI for machine learning, a portion of the fabrication device information image MDI may be selected as one of the multi-channel images CI[1:4]. A location of the target fabrication device information image TMDI on the fabrication device information image MDI may correspond to (e.g., may be similar and/or identical to) a location of the target layout image TLI on the layout image LI. For example, pixels of the target fabrication device information image TMDI may have the same value in a first direction, and the value of the pixels may change (e.g., increase or decrease) continuously (or sequentially) consistently in a second direction.

The density image DI may be generated from the layout image LI. The density image DI may include information about a density of patterns and/or spaces on the layout image LI. For example, the density image DI may be generated by performing Gaussian convolution and/or blurring on the layout image LI. The Gaussian convolution may include performing a convolution operation on the layout image LI and a two-dimensional filter having values corresponding to the Gaussian distribution.

A range of interest ROI may be selected from the density image DI. The range of interest ROI may include regions that are regarded as affecting the target layout image TLI upon forming a portion corresponding to the target layout image TLI. A location of the range of interest ROI on the density image DI may correspond to (e.g., may include) a location of, e.g., the target layout image TLI on the layout image LI, the target under layout image TULI on the under layout image ULI, and/or the target fabrication device information image TMDI on the fabrication device information image MDI. A size of the range of interest ROI may be larger than a size of the target layout image TLI.

The size of the range of interest ROI may be downscaled to the size of the target layout image TLI (refer to "DS" in FIG. 4). A downscaled target density image TDI may be selected as one of the multi-channel images CI[1:4]. However, the example embodiments are not limited thereto, and in at least one embodiment, the downscale DS may be omitted, and the range of interest ROI may be selected as the target density image TDI.

According to some embodiments of the present disclosure, as well as the target layout image TLI of a current layer, at least one of the following images are applied to the learning (or training) for inferring the second wafer image WI2: 1) the target under layout image TULI to which the effect of a under layer is applied, 2) the target density image TDI to which the long-range effect is applied, and 3) the target fabrication device information image TMDI to which the effect according to a location of a semiconductor fabrication device is applied. Accordingly, the second wafer image WI2 may be inferred (or predicted) more accurately. Also, according to embodiments of the present disclosure, the learning for inferring (predicting and/or generating) the second wafer image WI2 from the layout image LI may be performed without distinguishing the OPC and the PPC. Accordingly, a time necessary for the learning (or training) may be shortened.

Figure 5:
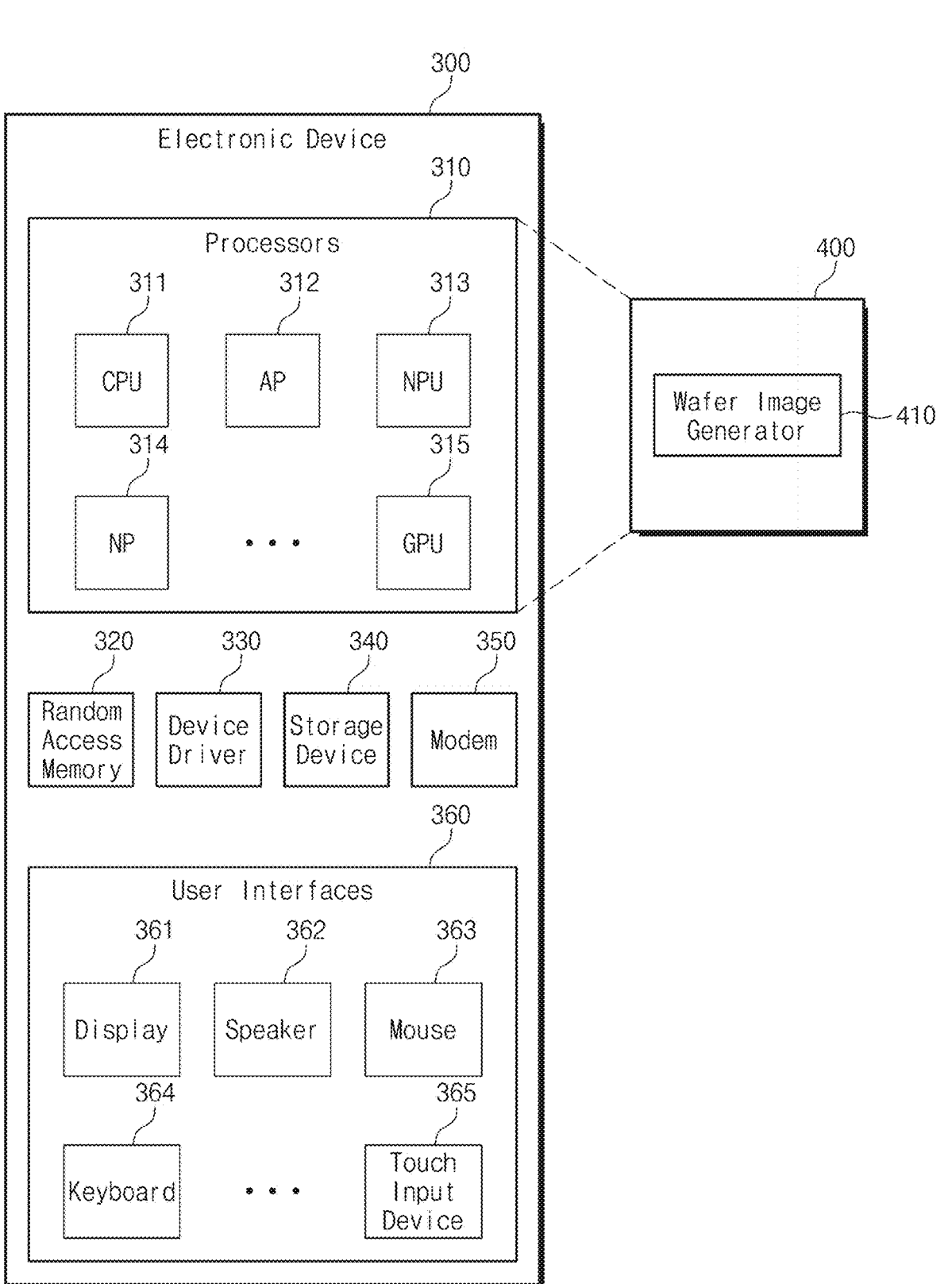
FIG. 5 is a block diagram illustrating an electronic device according to at least one example embodiment of the present disclosure.

FIG. 5 is a block diagram illustrating an electronic device 300 according to an embodiment of the present disclosure. Referring to FIG. 5, the electronic device 300 may include processors 310, a random access memory 320, a device driver 330, a storage device 340, a modem 350, and user interfaces 360. The processors 310, the random access memory 320, the device driver 330, the storage device 340, the modem 350, and/or the user interfaces 360 of the electronic device 300 may be substantially similar and/or identical to processors 110, the random access memory 120, the device driver 130, the storage device 140, the modem 150, and/or the user interfaces 160 of the electronic device 100, except that the processors 310 may drive (or operate) a semiconductor layout simulation module 400.

The random access memory 320 may store images that are necessary for and/or initialized by the semiconductor layout simulation module 400 to infer (predict and/or generate) a wafer image. For example, the random access memory 320 may receive images from the storage device 340 or may receive images from an external device (e.g., a database) through the modem 350.

The storage device 340 may store images that are necessary for and/or utilized in the semiconductor layout simulation module 400 to infer (predict and/or generate) a wafer image. The images stored in the storage device 340 may be loaded onto the random access memory 320 and may be used for inference (prediction and/or generation) of the semiconductor layout simulation module 400.

The semiconductor layout simulation module 400 may include a wafer image generator 410. As in the wafer image generator 210 described with reference to FIGS. 2, 3, and 4, the wafer image generator 410 may generate a wafer image from the multi-channel images CI[1:n]. For example, the wafer image generator 210 whose learning (or training) is completed in the electronic device 100 may be included in the semiconductor layout simulation module 400. For example, the wafer image generator 410 may be trained in and/or transferred to the semiconductor layout simulation module 400. As described with reference to FIG. 4, the multi-channel images CI[1:n] may include the target layout image TLI, the target under layout image TULI, the target fabrication device information image TMDI, and the target density image TDI.

Figure 6:
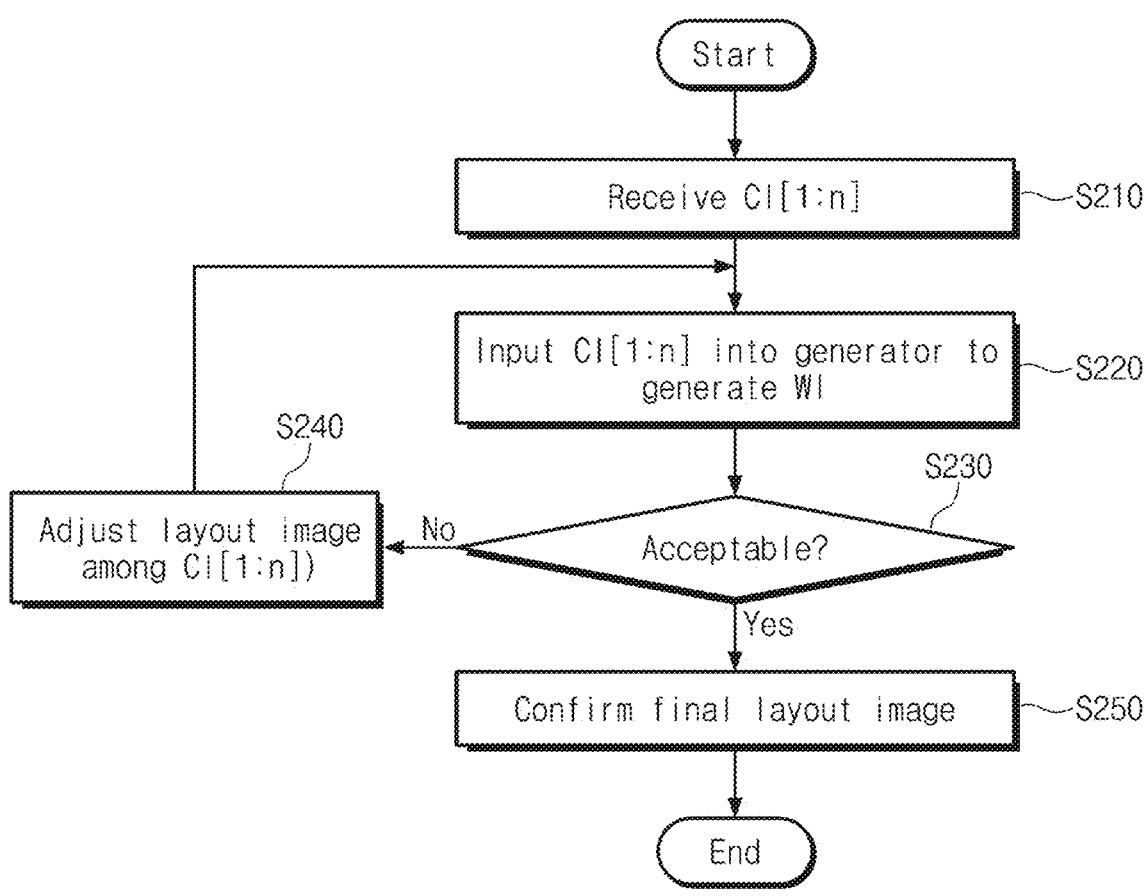
FIG. 6 illustrates an example of an operating method of an electronic device of FIG. 5.

FIG. 6 illustrates an example of an operating method of the electronic device 300 of FIG. 5. Referring to FIGS. 5 and 6, in operation S210, the processors 310 may receive the multi-channel images CI[1:n]. For example, the processors 310 may receive the multi-channel images CI[1:n] from the memory 320.

In operation S220, the processors 310 may input the multi-channel images CI[1:n] into the wafer image generator 410 of the semiconductor layout simulation module 400 to generate the wafer image WI.

In operation S230, the processors 310 may determine whether the wafer image WI is acceptable. For example, when a defect is present in the wafer image WI or when shapes of patterns of the wafer image WI are different from shapes of patterns on an original layout image (e.g., when a difference between the pattern shapes of the original layout image and the pattern shapes of the wafer image WI is greater than a threshold value), the wafer image WI may be considered unacceptable. When it is determined that the wafer image WI is unacceptable, in operation S240, the processors 310 may adjust the layout image of the multi-channel images CI[1:n].

For example, the processors 310 may divide patterns or spaces into segments and may adjust a location of each of the segments. Segments may be separated from each other at an edge where boundaries of the patterns or spaces cross each other.

For example, when a defect is absent from the wafer image WI and/or when the shapes of the patterns of the wafer image WI are identical and/or substantially similar to the shapes of the patterns of the original layout image (e.g., when the difference between the pattern shapes of the original layout image and the pattern shapes of the wafer image WI is equal to or smaller than threshold value), the wafer image WI may be acceptable. When it is determined that the wafer image WI is acceptable, in operation S250, the processors 310 may confirm a current layout image as a final layout image. In some example embodiments, the electronic device 300 may transmit instructions to semiconductor fabrication equipment including the semiconductor fabrication device based on the confirmed layout image, and the semiconductor fabrication device and/or equipment may process a wafer based on the confirmed layout image. Accordingly, the electronic device 300 may be used to reject a layout, adjust (or fix) a layout, confirm a layout, and/or instruct a semiconductor fabrication device and/or equipment to construct a wafer based on a confirmed layout.

According to some embodiments of the present disclosure, as well as a target layout image of a current layer, a target under layout image to which the effect of a under layer is applied, a target density image to which the long-range effect is applied, and a target fabrication device information image to which the effect according to a location of a semiconductor fabrication device is applied are used. Accordingly, a wafer image may be inferred more accurately. Also, according to embodiments of the present disclosure, a wafer image may be inferred (predicted and/or generated) from a layout image without distinguishing the OPC and the PPC. Accordingly, a time necessary for the inference (prediction and/or generation) may decrease.

Figure 7:
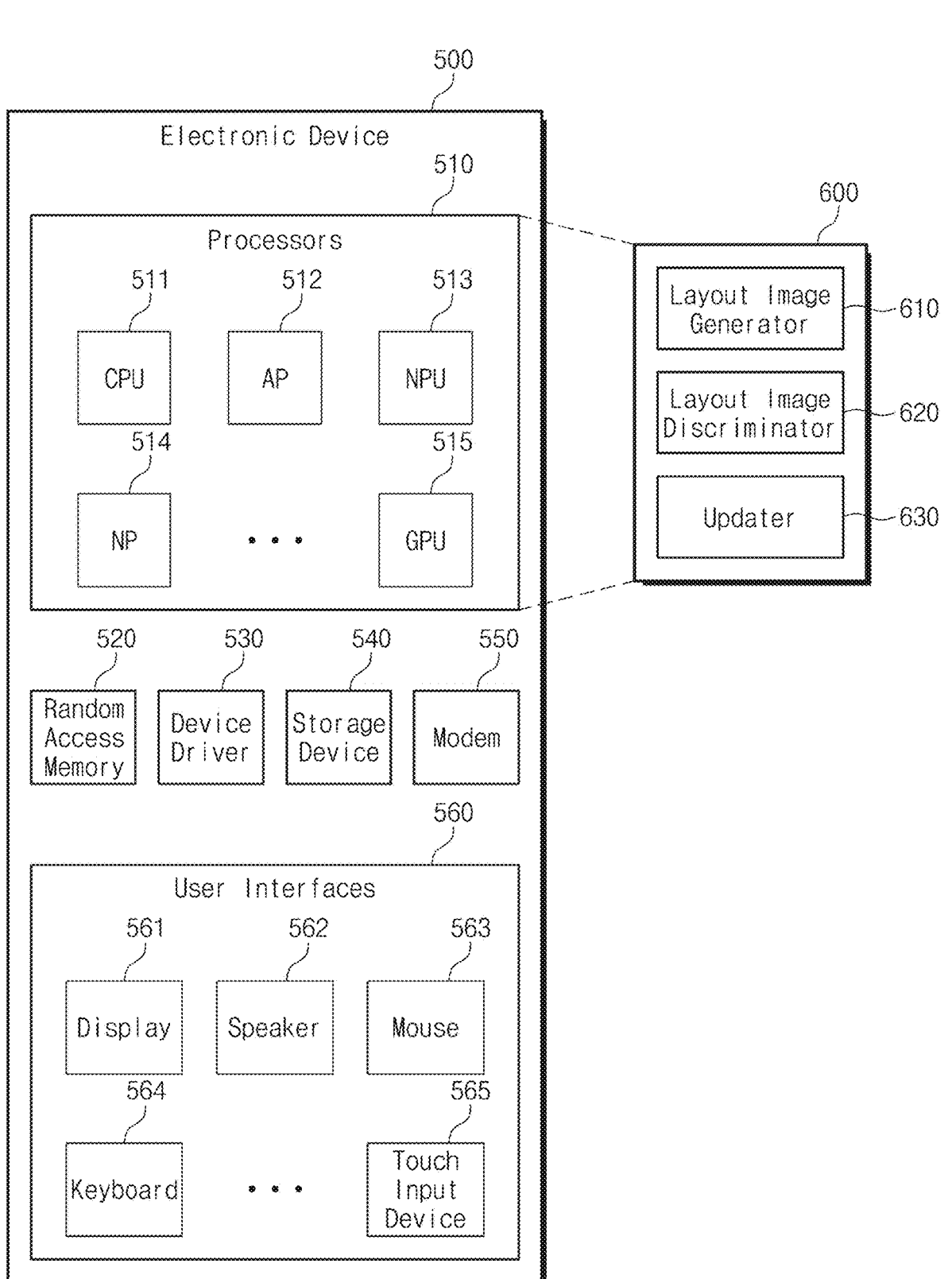
FIG. 7 is a block diagram illustrating an electronic device according to at least one example embodiment of the present disclosure.

FIG. 7 is a block diagram illustrating an electronic device 500 according to an embodiment of the present disclosure. Referring to FIG. 7, the electronic device 500 may include processors 510, a random access memory 520, a device driver 530, a storage device 540, a modem 550, and user interfaces 560. The processors 510, the random access memory 520, the device driver 530, the storage device 540, the modem 550, and/or the user interfaces 560 of the electronic device 500 may be substantially similar and/or identical to processors 110, the random access memory 120, the device driver 130, the storage device 140, the modem 150, and/or the user interfaces 160 of the electronic device 100, except that the processors 510 may drive (or operate) a semiconductor layout simulation module 600.

The random access memory 520 may store images that are necessary for and/or utilized in the learning of the semiconductor layout simulation module 600. For example, the random access memory 520 may receive images from the storage device 540 or may receive images from an external device (e.g., a database) through the modem 550.

The storage device 540 may store images that are necessary for and/or utilized in the learning of the semiconductor layout simulation module 600. The images stored in the storage device 540 may be loaded onto the random access memory 520 and may be used for the learning of the semiconductor layout simulation module 600.

The semiconductor layout simulation module 600 may include a layout image generator 610, a layout image discriminator 620, and an updater 630. The layout image generator 610 may be trained to generate an adjusted layout image, to which the OPC and the PPC for generation of a wafer image is applied, from a wafer image (e.g., a scanning electron microscope (SEM) image of a wafer, and/or an original layout image to which the OPC and the PPC corresponding to a target image of semiconductor patterns intended to be formed on the wafer are applied).

The layout image discriminator 620 may discriminate which of a layout image (e.g., a target layout image) for fabricating a semiconductor integrated circuit and a layout image generated by the layout image generator 610 is true and which thereof is false. The updater 630 may train the layout image generator 610 and the layout image discriminator 620 depending on a discrimination result of the layout image discriminator 620.

In an embodiment, the layout image generator 610, the layout image discriminator 620, and the updater 630 may be implemented based on a generative adversarial network (GAN) and/or a conditional GAN (CGAN). In at least one embodiment, the layout image generator 610, the layout image discriminator 620, and the updater 630 may perform learning based on the images stored in the random access memory 520.

Figure 8:
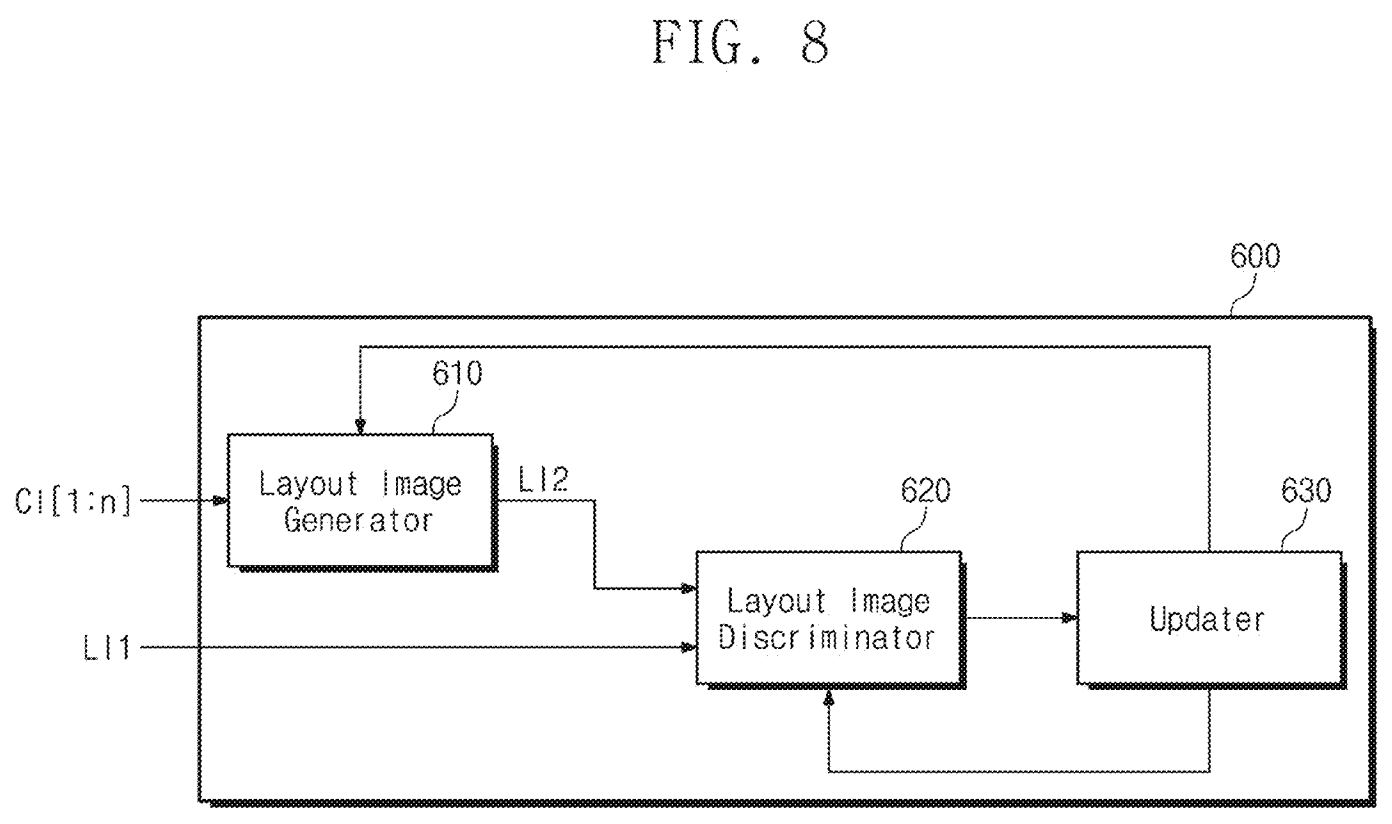

FIG. 8 illustrates an example of the semiconductor layout simulation module 600 in detail. Referring to FIGS. 7 and 8, the semiconductor layout simulation module 600 may receive the multi-channel images CI[1:n] and a first layout image LI1. In at least one embodiment, the multi-channel images CI[1:n] and/or a first wafer image WI1 may be received from the memory 520 and/or from an imaging device. The first layout image LI1 may refer to an adjusted layout image for fabricating a semiconductor integrated circuit (e.g., a layout image that is generated by applying the OPC and the PPC to an original layout image). For example, the first layout image LI1 may be a portion cropped from the adjusted layout image.

The multi-channel images CI[1:n] may include a plurality of images. The multi-channel images CI[1:n] may include first to n-th images. Each of the first to n-th images may include effects of various factors on the process of fabricating the semiconductor integrated circuit. One of the multi-channel images CI[1:n] may include a wafer image of the semiconductor integrated circuit. The wafer image may be a portion cropped from the original wafer image, for example, a portion corresponding to the first layout image LI1.

The layout image generator 610 may generate a second layout image LI2 from the multi-channel images CI[1:n]. For example, the layout image generator 610 may generate the second layout image LI2 from the multi-channel images CI[1:n] by using internal parameters.

The layout image discriminator 620 may receive the first layout image LI1 and the second layout image LI2. The layout image discriminator 620 may discriminate which of the first layout image LI1 and the second layout image LI2 is a true layout image and which thereof is a false layout image. For example, by using the internal parameters, the layout image discriminator 620 may discriminate which of the first layout image LI1 and the second layout image LI2 is a true layout image and which is a false layout image.

The updater 630 may receive a discrimination result of the layout image discriminator 620. The updater 630 may train the layout image generator 610 and the layout image discriminator 620 sequentially or simultaneously, based on the discrimination result. For example, the updater 630 may train the layout image generator 610 by updating internal parameters of the layout image generator 610, and/or the updater 630 may train the layout image discriminator 620 by updating internal parameters of the layout image discriminator 620.

Figure 9:
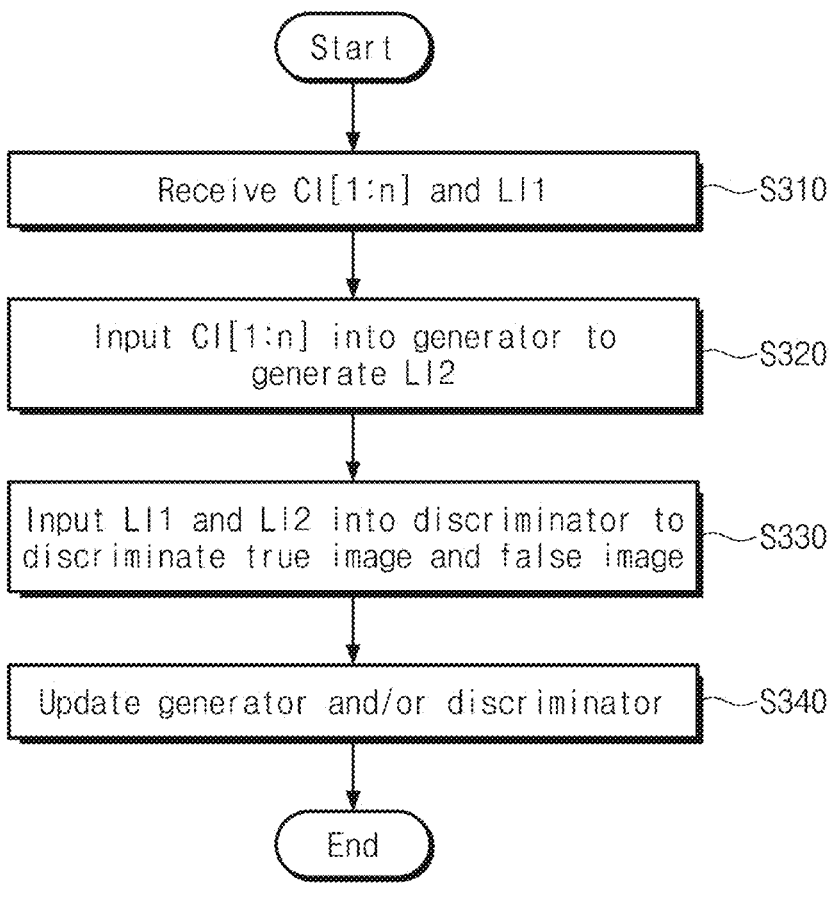
FIG. 9 illustrates an operating method of a semiconductor layout simulation module executed by processors.

FIG. 9 illustrates an operating method of the semiconductor layout simulation module 600 executed by the processors 510. Referring to FIGS. 7, 8, and 9, in operation S310, the processors 510 may receive the multi-channel images CI[1:n] and the first layout image LI1. For example, the processors 510 may receive the multi-channel images CI[1:n] and the first layout image LI1 from the memory 520. For example, in some example embodiments, the first layout image LI1 may be a "true" image of a layout taken by an imaging device.

In operation S320, the processors 510 may input the multi-channel images CI[1:n] into the layout image generator 610 of the semiconductor layout simulation module 600 to generate the second layout image LI2. For example, in some example embodiments, the second layout image LI2 may be (and/or include) a "fake" image generated by the layout image generator 210.

In operation S330, the processors 510 may input the first layout image LI1 and the second layout image LI2 into the layout image discriminator 620 of the semiconductor layout simulation module 600 and may discriminate the true image and the false image.

In operation S340, the processors 510 may execute the updater 630 of the semiconductor layout simulation module 600 such that the layout image generator 610 and/or the layout image discriminator 620 is updated based on a discrimination result. For example, the updater 230 may calculate a loss function based on whether the discrimination result is correct or incorrect. The updater 230 may update the wafer image generator 210 and/or the wafer image discriminator 220 based on the loss function.

In at least one embodiment, the processors 510 of the electronic device 500 may repeatedly train the semiconductor layout simulation module 600 by using sets each including a wafer image and the multi-channel images CI[1:n] corresponding thereto. The processors 510 of the electronic device 500 may collect discrimination results that are based on a given number of sets of images and may update the internal parameters of the layout image generator 610 and/or the layout image discriminator 620 based on the collected discrimination results.

Figure 10:
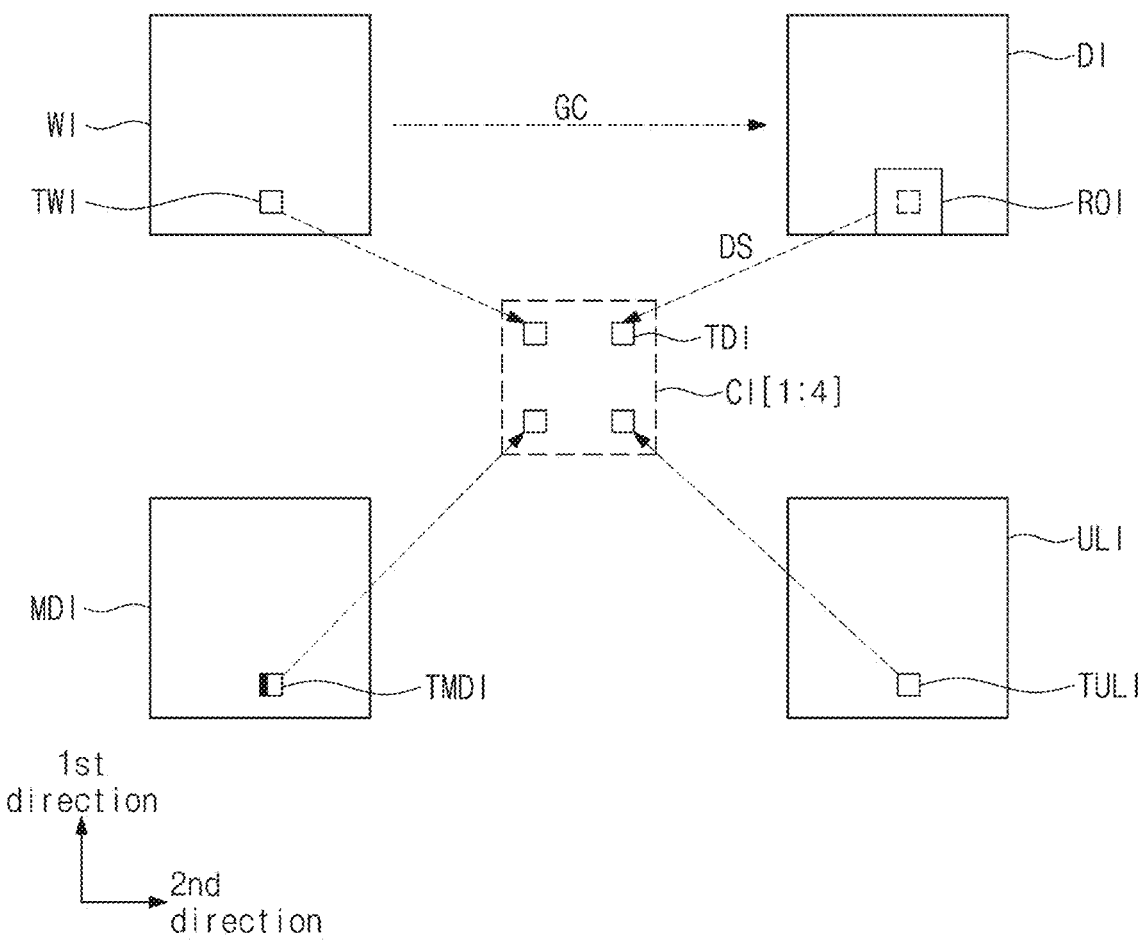
FIG. 10 illustrates examples of multi-channel images.

FIG. 10 illustrates examples of the multi-channel images CI[1:n]. In at least one embodiment, the multi-channel images CI[1:n] may include 4 images, and "n" may be 4. However, a value of "n" is not limited thereto. Referring to FIGS. 8 and 10, the multi-channel images CI[1:4] may be cropped from the wafer image WI, the under layout image ULI, the fabrication device information image MDI, and the density image DI.

A semiconductor integrated circuit may include a plurality of layers that are sequentially stacked. The wafer image WI may refer to a wafer image of a semiconductor integrated circuit, which is generated based on a layout image (i.e., an original layout image or an adjusted layout image) for forming a current layer. As a target wafer image TWI for machine learning, a portion of the wafer image WI may be selected as one of the multi-channel images CI[1:4].

The under layout image ULI may refer to a layout image of the under layer (e.g., an original layout image of the under layer or an SEM image of the under layout). As a target under layout image TULI for machine learning, a portion of the under layout image ULI may be selected as one of the multi-channel images CI[1:4]. A location of the target under layout image TULI on the under layout image ULI may correspond to (e.g., may be similar and/or identical to) a location of the target wafer image TWI on the wafer image WI.

The fabrication device information image MDI may include information about the effect of the semiconductor fabrication device on the process in which the fabrication device forms a semiconductor integrated circuit. For example, information about effects of the semiconductor fabrication device that are different depending on locations on the wafer image WI may be included in the fabrication device information image MDI.

For example, a slit of the EUV-based semiconductor fabrication device may differently affect the semiconductor integrated circuit depending on locations on the wafer image WI. The fabrication device information image MDI may include an effect information image of the slit.

As a target fabrication device information image TMDI for machine learning, a portion of the fabrication device information image MDI may be selected as one of the multi-channel images CI[1:4]. A location of the target fabrication device information image TMDI on the fabrication device information image MDI may correspond to (e.g., may be similar and/or identical to) a location of the target wafer image TWI on the wafer image WI. For example, pixels of the target fabrication device information image TMDI may have the same value in a first direction, and the value of the pixels may change (e.g., increase or decrease) continuously (or sequentially) consistently.

The density image DI may be generated from the wafer image WI. The density image DI may include information about a density of patterns and/or spaces on the wafer image WI. For example, the density image DI may be generated by performing Gaussian convolution or blurring on the wafer image WI. The Gaussian convolution may include performing a convolution operation on the wafer image WI and a two-dimensional filter having values corresponding to the Gaussian distribution.

The range of interest ROI may be selected from the density image DI. The range of interest ROI may include regions that are regarded as affecting the target wafer image TWI upon forming a portion corresponding to the target wafer image TWI. A location of the range of interest ROI on the density image DI may correspond to (e.g., may include) a location of the target wafer image TWI on the wafer image WI, the target under layout image TULI on the under layout image ULI, and/or the target fabrication device information image TMDI on the fabrication device information image MDI. A size of the range of interest ROI may be larger than a size of the target wafer image TWI.

The size of the range of interest ROI may be downscaled to the size of the target wafer image TWI (refer to "DS" in FIG. 10). A downscaled target density image TDI may be selected as one of the multi-channel images CI[1:4]. In some example embodiments, the downscale DS may be omitted.

According to embodiments of the present disclosure, when the learning is performed to infer the second layout image LI2, as well as the target wafer image TWI of a current layer, at least one of the following images are applied to the learning: 1) the target under layout image TULI to which the effect of a under layer is applied, 2) the target density image TDI to which the long-range effect is applied, and/or 3) the target fabrication device information image TMDI to which the effect according to a location of a semiconductor fabrication device is applied. Accordingly, the second layout image LI2 may be inferred (or predicted) more accurately.

Also, according to embodiments of the present disclosure, the learning for inferring (predicting and/or generating) the second layout image LI2 from the wafer image WI may be performed without distinguishing the OPC and the PPC. Accordingly, a time necessary for the learning may decrease.

Figure 11:
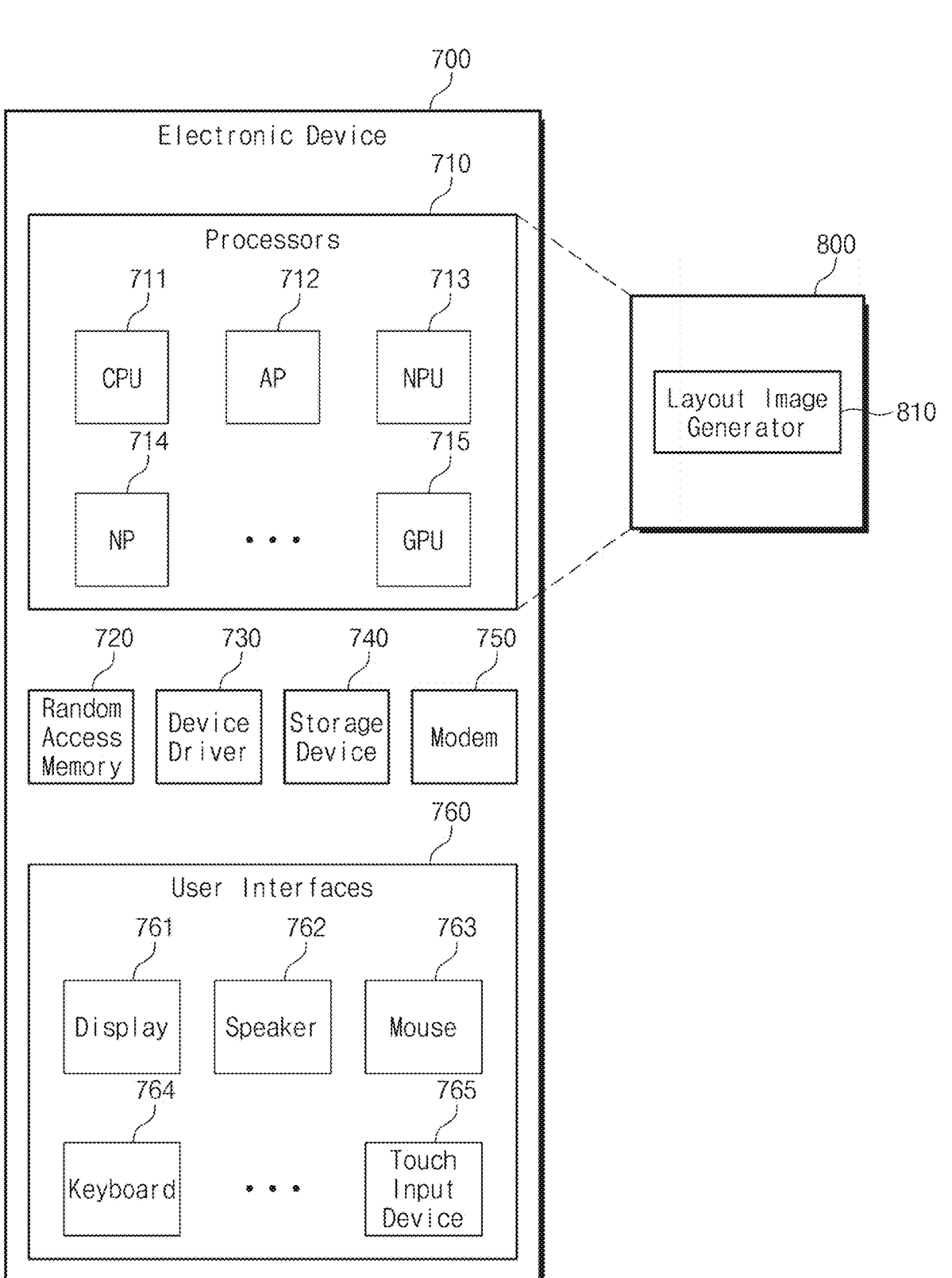
FIG. 11 is a block diagram illustrating an electronic device according to at least one example embodiment of the present disclosure.

FIG. 11 is a block diagram illustrating an electronic device 700 according to an embodiment of the present disclosure. Referring to FIG. 11, the electronic device 700 may include processors 710, a random access memory 720, a device driver 730, a storage device 740, a modem 750, and user interfaces 760. The processors 710, the random access memory 720, the device driver 730, the storage device 740, the modem 750, and/or the user interfaces 760 of the electronic device 700 may be substantially similar and/or identical to processors 310, the random access memory 320, the device driver 330, the storage device 340, the modem 350, and/or the user interfaces 360 of the electronic device 300, except that the processors 710 may drive (or operate) a layout simulation module 800.

The random access memory 720 may store images that are necessary for and/or utilized in the semiconductor layout simulation module 800 to infer (predict and/or generate) a layout image. For example, the random access memory 720 may receive images from the storage device 740 or may receive images from an external device (e.g., a database) through the modem 750. An operation and/or a configuration of the random access memory 720 may be similar (or identical) to the operation and/or the configuration of the random access memory 320 described with reference to FIG. 5.

The storage device 740 may store images that are necessary for and/or utilized in the semiconductor layout simulation module 800 to infer (predict and/or generate) a layout image. The images stored in the storage device 740 may be loaded onto the random access memory 720 and may be used for inference (prediction and/or generation) of the semiconductor layout simulation module 800. An operation and/or a configuration of the storage device 740 may be similar (or identical) to the operation and/or the configuration of the storage device 340 described with reference to FIG. 5.

The semiconductor layout simulation module 800 may include a layout image generator 810. As in the layout image generator 610 described with reference to FIGS. 8, 9, and 10, the layout image generator 810 may generate a layout image from the multi-channel images CI[1:n]. For example, the layout image generator 610 whose learning is completed in the electronic device 500 may be included in the semiconductor layout simulation module 800. As described with reference to FIG. 10, the multi-channel images CI[1:n] may include the target wafer image TWI, the target under layout image TULI, the target fabrication device information image TMDI, and the target density image TDI.

Figure 12:
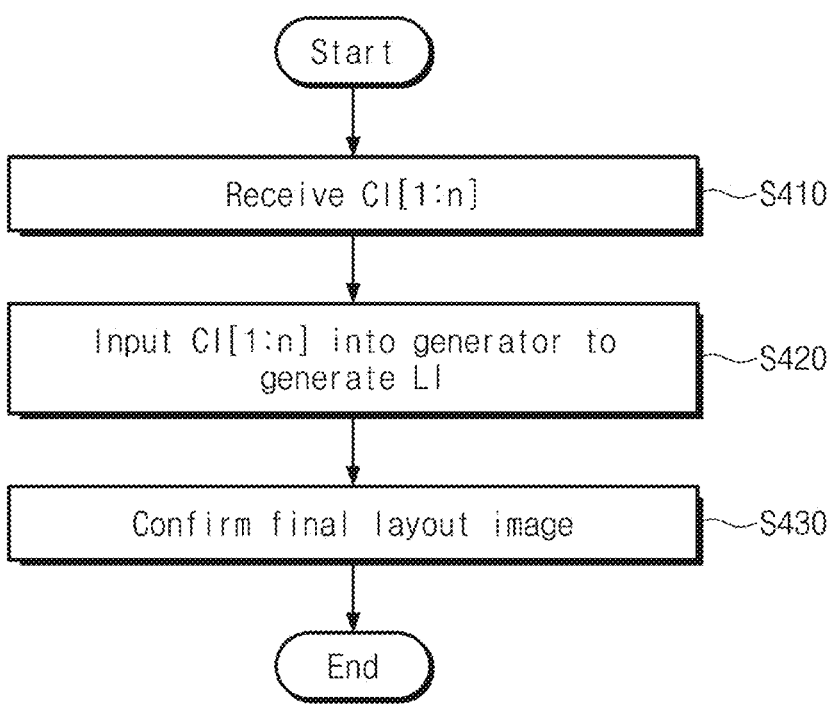
FIG. 12 illustrates an example of an operating method of an electronic device of FIG. 11.

FIG. 12 illustrates an example of an operating method of the electronic device 700 of FIG. 11. Referring to FIGS. 11 and 12, in operation S410, the processors 710 may receive the multi-channel images CI[1:n]. For example, the processors 710 may receive the multi-channel images CI[1:n] from the memory 720.

In operation S420, the processors 710 may input the multi-channel images CI[1:n] into the layout image generator 810 of the semiconductor layout simulation module 800 to generate the layout image LI.

In operation S430, the processors 710 may confirm the layout image LI thus generated as a final layout image. In some example embodiments, the electronic device 700 may transmit instructions to a semiconductor fabrication device based on the confirmed layout image L1, and the semiconductor fabrication device may process a wafer based on the confirmed layout image L1. Accordingly, the electronic device 700 may be used to reject a layout, adjust (or fix) a layout, confirm a layout, and/or instruct a semiconductor fabrication device based on a confirmed layout.

According to embodiments of the present disclosure, as well as a target wafer image of a current layer, a target under layout image to which the effect of a under layer is applied, a target density image to which the long-range effect is applied, and a target fabrication device information image to which the effect according to a location of a semiconductor fabrication device is applied are used. Accordingly, the layout image LI may be inferred more accurately. Also, according to embodiments of the present disclosure, a layout image may be inferred (predicted and/or generated) from a wafer image without distinguishing the OPC and the PPC. Accordingly, a time necessary for the inference may decrease.

Figure 13:
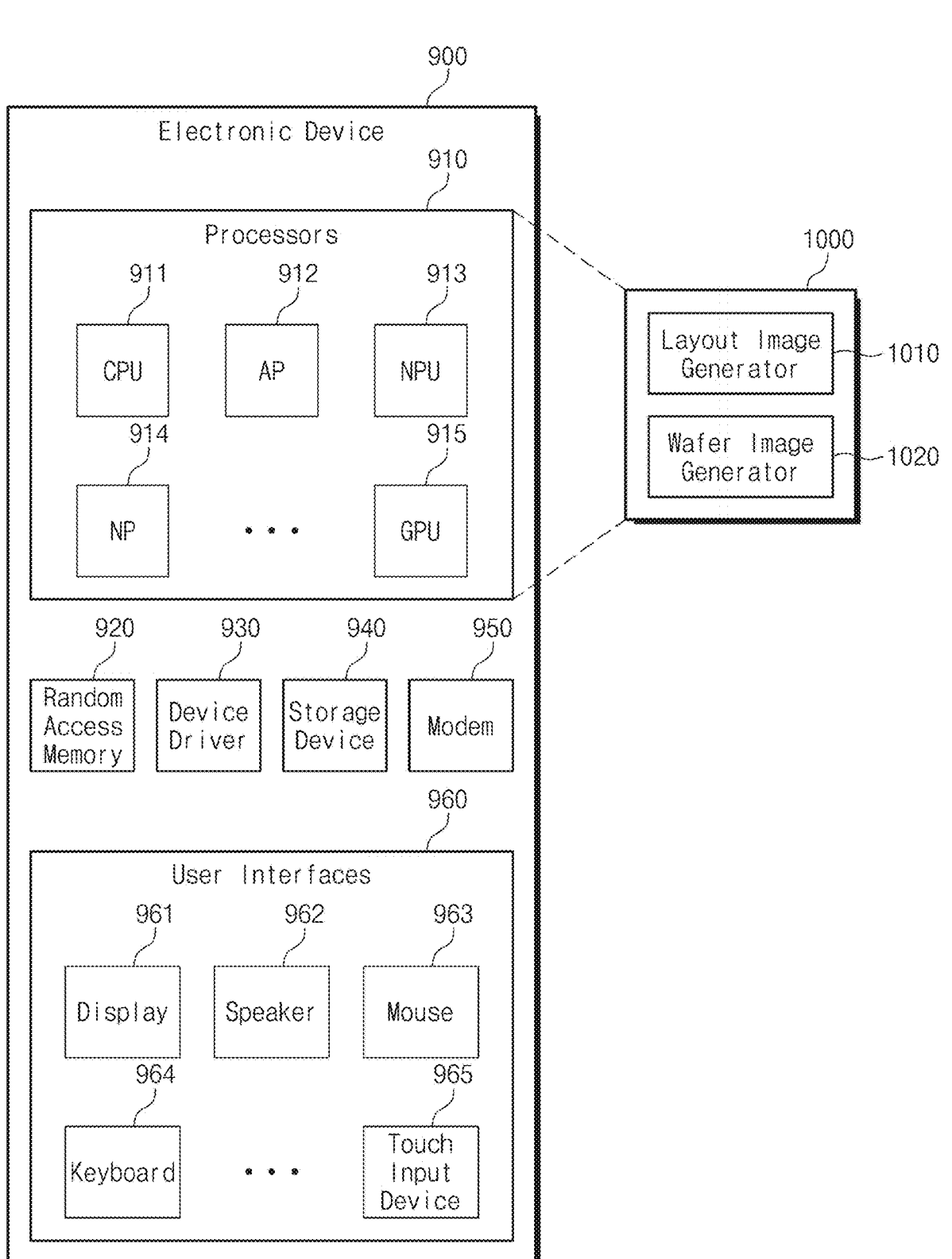
FIG. 13 is a block diagram illustrating an electronic device according to at least one example embodiment of the present disclosure.

FIG. 13 is a block diagram illustrating an electronic device 900 according to an embodiment of the present disclosure. Referring to FIG. 13, the electronic device 900 may include processors 910, a random access memory 920, a device driver 930, a storage device 940, a modem 950, and user interfaces 960. The processors 910, the random access memory 920, the device driver 930, the storage device 940, the modem 950, and/or the user interfaces 960 of the electronic device 900 may be substantially similar and/or identical to processors 310, the random access memory 320, the device driver 330, the storage device 340, the modem 350, and/or the user interfaces 360 of the electronic device 300 (and/or processors 710, the random access memory 720, the device driver 730, the storage device 740, the modem 750, and/or the user interfaces 760 of the electronic device 700), except that the processors 910 may drive (or operate) a semiconductor layout simulation module 1000. The semiconductor layout simulation module 1000 may include a layout image generator 1010 and a wafer image generator 1020.

As in the layout image generator 610 described with reference to FIGS. 8, 9, and 10, the layout image generator 1010 may generate a layout image from first multi-channel images CI1[1:n] (refer to FIG. 14). For example, the layout image generator 610 whose learning is completed in the electronic device 500 may be included in the layout image generator 1010 of the semiconductor layout simulation module 1000. As described with reference to FIG. 10, the first multi-channel images CI1[1:n] may include the target wafer image TWI, the target under layout image TULI, the target fabrication device information image TMDI, and the target density image TDI.

As in the wafer image generator 210 described with reference to FIGS. 2, 3, and 4, the wafer image generator

Figure 14:
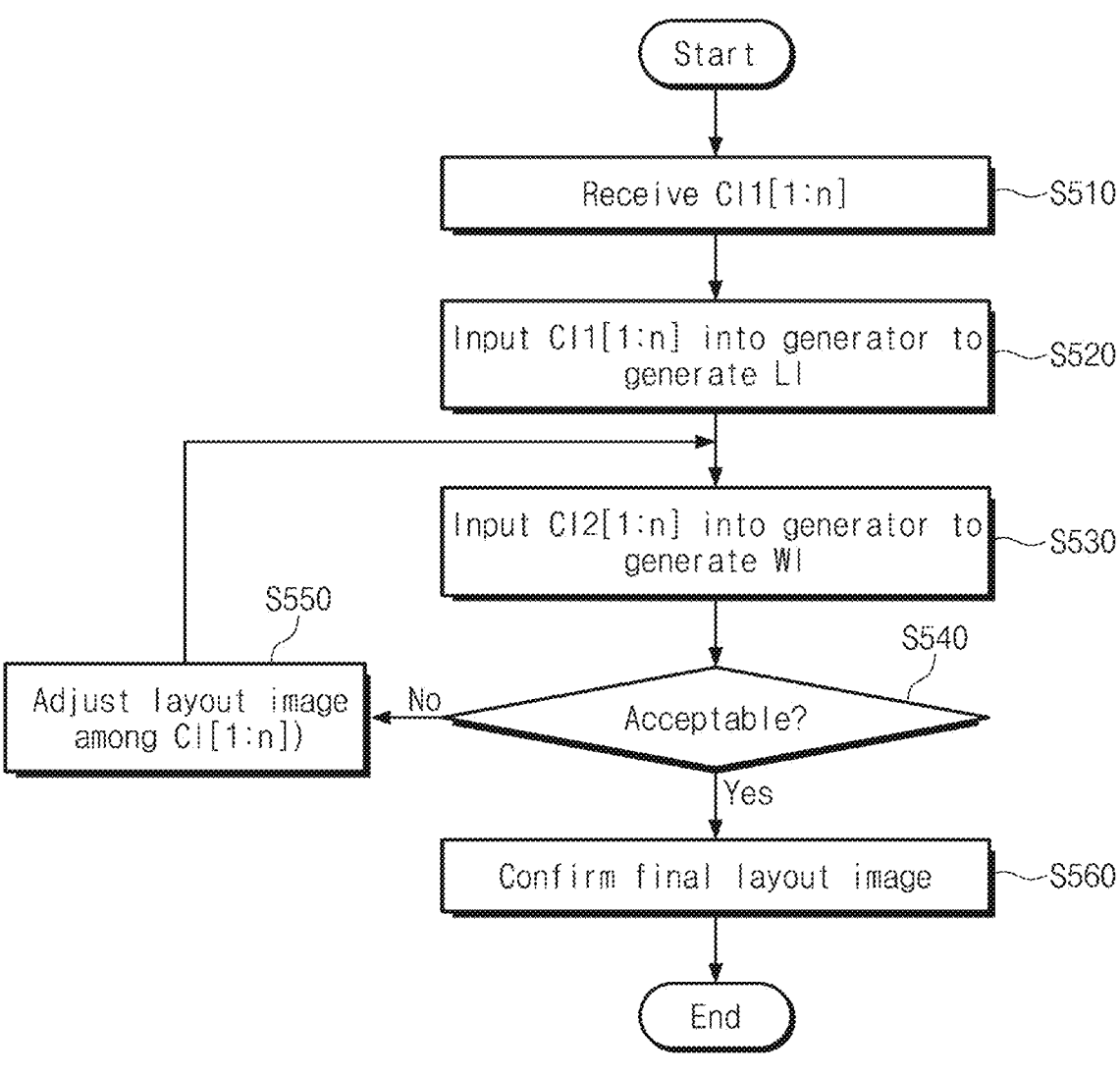
FIG. 14 illustrates an example of an operating method of an electronic device of FIG. 13.

1020 may generate a wafer image from second multi-channel images CI2[1:n] (refer to FIG. 14). For example, the wafer image generator 210 whose learning is completed in the electronic device 100 may be included in the wafer image generator 1020 of the semiconductor layout simulation module 1000. As described with reference to FIG. 4, the second multi-channel images CI2[1:n] may include the target layout image TLI, the target under layout image TULI, the target fabrication device information image TMDI, and the target density image TDI.

FIG. 14 illustrates an example of an operating method of the electronic device 900 of FIG. 13. Referring to FIGS. 13 and 14, in operation S510, the processors 910 may receive the first multi-channel images CI1[1:n]. For example, the processors 910 may receive the first multi-channel images CI1[1:n] from the memory 920. The first multi-channel images CI1[1:n] may include a target wafer image, a target under layout image, a target fabrication device information image, and a target density image. For example, the target wafer image may be cropped from an original layout image.

In operation S520, the processors 910 may input the first multi-channel images CI1[1:n] into the layout image generator 1010 of the semiconductor layout simulation module 1000 to generate the layout image LI. The layout image LI may refer to a result that is inferred (predicted and/or generated) by the layout image generator 1010 as semiconductor patterns corresponding to shapes of patterns and/or spaces of the first multi-channel images CI1[1:n] are appropriate for the formation on a wafer.

The layout image LI thus generated may constitute the second multi-channel images CI2[1:n] together with the target under layout image, the target fabrication device information image, and the target density image included in the first multi-channel images CI1[1:n]. The second multi-channel images CI2[1:n] may be stored in the memory 920.

In operation S530, the processors 910 may input the second multi-channel images CI2[1:n] into the wafer image generator 1020 of the semiconductor layout simulation module 1000 to generate the wafer image WI. The wafer image WI may include semiconductor patterns that are inferred (or predicted or generated) by the wafer image generator 1020 as being formed on a semiconductor wafer upon semiconductor patterns on the semiconductor wafer by using the layout image LI.

In operation S540, the processors 910 may determine whether the wafer image WI is acceptable. For example, when a defect is present in the wafer image WI and/or when shapes of patterns of the wafer image WI are different from shapes of patterns on an original layout image (e.g., when a difference between the pattern shapes of the original layout image and the pattern shapes of the wafer image WI is greater than a threshold value), the wafer image WI may be considered unacceptable. When it is determined that the wafer image WI is unacceptable, in operation S550, the processors 910 may adjust the layout image of the second multi-channel images CI2[1:n].

For example, the processors 910 may divide patterns or spaces into segments and may adjust a location of each of the segments. Segments may be separated from each other at an edge where boundaries of the patterns or spaces cross each other.

For example, when a defect is absent from the wafer image WI and/or when the shapes of the patterns of the wafer image WI are identical and/or substantially similar to the shapes of the patterns of the original layout image (e.g., when the difference between the pattern shapes of the original layout image and the pattern shapes of the wafer image WI is equal to or smaller than threshold value), the wafer image WI may be acceptable. When it is determined that the wafer image WI is acceptable, in operation S560, the processors 910 may confirm the current layout image LI as a final layout image. In some example embodiments, the electronic device 900 may transmit instructions to a semiconductor fabrication device based on the confirmed layout image, and the semiconductor fabrication device may process a wafer based on the confirmed layout image. Accordingly, the electronic device 900 may be used to reject a layout, adjust (or fix) a layout, confirm a layout, and/or instruct a semiconductor fabrication device to construct a wafer based on a confirmed layout.

Figure 15:
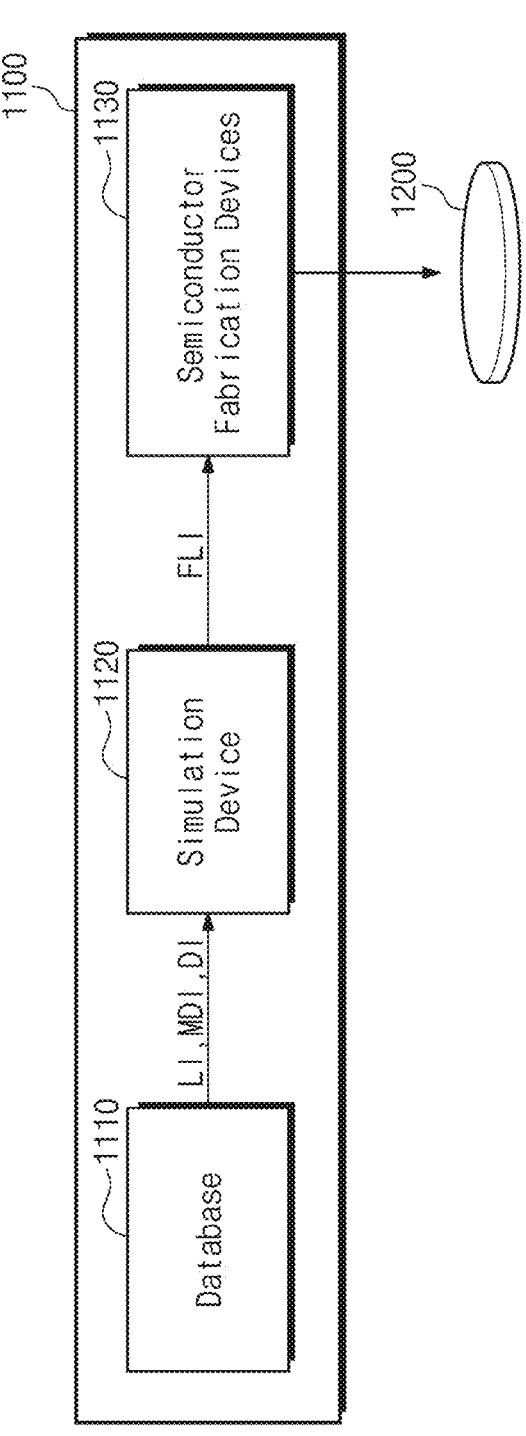
FIG. 15 illustrates an example of a semiconductor fabrication system fabricating a semiconductor integrated circuit.

FIG. 15 illustrates an example of a semiconductor fabrication system 1100 fabricating a semiconductor integrated circuit 1200. Referring to FIG. 15, the semiconductor fabrication system 1100 may include a database 1110, a simulation device 1120, and semiconductor fabrication devices 1130.

The database 1110 may store the layout images LI of a plurality of layers for the fabrication of the semiconductor integrated circuit 1200, the fabrication device information image MDI, and the density images DI corresponding to the plurality of layers. The database 1110 may provide the layout images LI, the fabrication device information image MDI, and the density images DI to the simulation device 1120.

The simulation device 1120 may receive the layout images LI, the fabrication device information image MDI, and the density images DI from the database 1110. The simulation device 1120 may generate final layout images FLI respectively corresponding to the plurality of layers depending on the method described with reference to FIG. 6, FIG. 12, and/or FIG. 14.

The semiconductor fabrication devices 1130 may fabricate the semiconductor integrated circuit 1200 based on the final layout images FLI. For example, the semiconductor fabrication devices 1130 may include various devices for exposure, etching, deposition, cleaning, and baking.

In the above embodiments, components according to the present disclosure are described by using the terms "first", "second", "third", etc. However, the terms "first", "second", "third", etc. are used to distinguish components from each other and do not limit the present disclosure. For example, the terms "first", "second", "third", etc. do not indicate an order or a numerical meaning of any form.

As will be appreciated by one skilled in the art, the example embodiments in this disclosure may be embodied as a system, method, computer program product, and/or a computer program product embodied in one or more computer readable medium(s) having computer readable program code embodied thereon. The computer readable program code may be provided to a processor of a general purpose computer, special purpose computer, and/or other programmable data processing apparatus. The computer readable medium may be a computer readable signal medium and/or a computer readable storage medium. The computer readable storage medium may be any tangible medium that can contain, and/or store a program for use by or in connection with an instruction execution system, apparatus, or device.

In this disclosure, the functional blocks denoting elements that process (and/or perform) at least one function or operation and may be included in and/or implemented as processing circuitry such hardware, software, or the combination of hardware and software. For example, the processing circuitry more specifically may include (and/or be included in), but is not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), semiconductor elements in an integrated circuit, circuits enrolled as an intellectual property (IP), etc. For example, the term "module" may refer to a software component and/or a hardware component such as a field programmable gate array (FPGA) or an application specific integrated circuit (ASIC), and/or combination of a hardware component and a software component. However, a "module" is not limited to software or hardware. A "module" may be configured to be included in an addressable storage medium or to reproduce one or more processors. Accordingly, for example, a "module" may include components such as software components, object-oriented software components, class components, and task components, processes. functions, attributes, procedures, subroutines, segments of program code, drivers, firmware, microcode, circuits, data, databases, data structures, tables, arrays, and variables. A function provided in components or modules may be integrated with a smaller number of components and/or divided into additional components.

The example embodiments may be applied to designing and manufacturing any electronic devices and systems. For example, the inventive concepts may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive driving system, etc. According to the present disclosure, pixel-based simulation is performed on a semiconductor integrated circuit by using machine learning. Also, the effect of a slit of an EUV semiconductor fabrication device and a feature of a long-range layout are applied to the simulation of the semiconductor integrated circuit. Accordingly, the accuracy of semiconductor simulation may be improved, and the yield of the semiconductor fabrication device may be improved.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of confirming a semiconductor layout using an electronic device which includes a processor configured to execute a semiconductor layout simulation module based on machine learning, the method comprising:

receiving, at the semiconductor layout simulation module, a layout image;

generating, at the semiconductor layout simulation module, a wafer image based on the layout image and a fabrication device information image, the fabrication device information image including at least one semiconductor integrated circuit fabricated by a semiconductor fabrication device based on at least one first final layout image;

determining whether the wafer image is acceptable;

adjusting the layout image when the wafer image is not acceptable; and confirming the layout image as a second final layout image when the wafer image is acceptable, wherein the layout image includes images of a plurality of layers, the images including a layout image of a current layout of a current layer and a layout image of an under layer.

2. The method of claim 1, wherein the fabrication device information image includes information about an effect of a slit of an extreme ultraviolet (EUV) device.

3. The method of claim 2, wherein values of pixels of the fabrication device information image are uniform in a first direction and change continuously in a second direction.

4. The method of claim 1, wherein the generating of the wafer image includes:

generating the wafer image based on the fabrication device information image, the layout image, and a density image, and wherein the density image includes information about a density of patterns of a region which includes the layout image and is wider than the layout image.

5. The method of claim 4, further comprising:

generating a whole density image by performing Gaussian convolution on a whole layout of a semiconductor integrated circuit to be generated based on the layout image; and selecting a portion associated with the layout image from the whole density image as the density image.

6. The method of claim 5, wherein a size of the layout image is smaller than a size of the portion associated with the layout image from the whole density image.

7. The method of claim 6, wherein the selecting of the portion associated with the layout image from the whole density image as the density image includes:

generating the density image by downscaling the portion associated with the layout image from the whole density image.

8. A method of generating layout image using an electronic device which includes a processor configured to execute a semiconductor layout simulation module based on machine learning, the method comprising:

receiving, at the semiconductor layout simulation module, a target wafer image, the target wafer image including a target pattern to be patterned in a semiconductor integrated circuit; and generating a layout image using a density image and the target wafer image as inputs for the semiconductor layout simulation module, wherein the density image is wider than the target wafer image and includes information about a density of patterns of a region which includes the target wafer image.

9. The method of claim 8, further comprising:

generating a whole density image by performing Gaussian convolution on a whole wafer image; and selecting a portion associated with the target wafer image from the whole density image as the density image.

10. The method of claim 9, wherein a size of the target wafer image is smaller than a size of the portion associated with the target wafer image from the whole density image.

11. The method of claim 10, wherein the selecting of the portion associated with the layout image from the whole density image as the density image includes:

generating the density image by downscaling the portion associated with the target wafer image from the whole density image.

12. The method of claim 8, wherein the generating of the layout image includes:

generating the layout image based on the density image, a target layout image, and a fabrication device information image of a semiconductor integrated circuit fabricated by a semiconductor fabrication device based on the layout image.

13. The method of claim 12, wherein the fabrication device information image includes information about an effect of a slit of an extreme ultraviolet (EUV) device.

14. The method of claim 13, wherein values of pixels of the fabrication device information image are uniform in a first direction and change continuously in a second direction.

15. A method of confirming a semiconductor layout using an electronic device which includes a processor configured to execute a semiconductor layout simulation module based on machine learning, the method comprising:

receiving, at the semiconductor layout simulation module, a target wafer image;

generating a layout image using, as inputs for the semiconductor layout simulation module, the target wafer image and at least one of a density image and a fabrication device information image of a semiconductor integrated circuit fabricated by a semiconductor fabrication device based on a first final layout image;

generating a wafer image based on the layout image and at least one of the fabrication device information image and the density image;

determining whether the wafer image is acceptable based on a comparison of the wafer image and the target wafer image;

adjusting the layout image when the wafer image is not acceptable;

confirming the layout image as a second final layout image when the wafer image is acceptable; and fabricating a semiconductor integrated circuit based on the confirmed layout image, wherein the density image includes information about a density of patterns of a region which includes the layout image and is wider than the layout image.

16. The method of claim 15, wherein the fabrication device information image includes information about an effect of a slit of an extreme ultraviolet (EUV) device.

17. The method of claim 16, wherein values of pixels of the fabrication device information image are uniform in a first direction and change continuously in a second direction.

18. The method of claim 17, further comprising:

generating a whole density image by performing Gaussian convolution on a whole layout of the semiconductor integrated circuit; and downscaling a portion associated with the layout image from the whole density image as the density image.

19. The method of claim 15, wherein the layout image includes a layout image of a current layout and a layout image of an under layer.

* * * * *